United States Patent [19]
Kess

[11] Patent Number: 5,280,249
[45] Date of Patent: Jan. 18, 1994

[54] CIRCULARLY POLARIZING LOCAL ANTENNA FOR A NUCLEAR MAGNETIC RESONANCE APPARATUS

[75] Inventor: Helmut Kess, Erlangen, Fed. Rep. of Germany

[73] Assignee: Siemens Aktiengesellschaft, Munich, Fed. Rep. of Germany

[21] Appl. No.: 970,055

[22] Filed: Nov. 2, 1992

[30] Foreign Application Priority Data

Nov. 25, 1991 [DE] Fed. Rep. of Germany ....... 4138690

[51] Int. Cl.$^5$ .............................................. G01V 3/00
[52] U.S. Cl. ................................... 324/318; 128/653.5
[58] Field of Search ............... 324/300, 307, 309, 316, 324/318, 322; 128/653.5

[56] References Cited

U.S. PATENT DOCUMENTS

| | | | |
|---|---|---|---|
| 4,721,913 | 1/1988 | Hyde et al. ..................... | 128/653.5 |
| 5,057,777 | 10/1991 | Kurczewski ..................... | 324/318 |
| 5,144,241 | 9/1992 | Oppelt et al. .................... | 324/318 |
| 5,153,517 | 10/1992 | Oppelt et al. .................... | 324/318 |

FOREIGN PATENT DOCUMENTS

| | | |
|---|---|---|
| 0234786 | 9/1987 | European Pat. Off. . |
| 2105281 | 8/1971 | Fed. Rep. of Germany ...... 324/318 |
| 3133432 | 3/1983 | Fed. Rep. of Germany . |

Primary Examiner—Louis Arana
Attorney, Agent, or Firm—Hill, Steadman & Simpson

[57] ABSTRACT

In a circularly polarizing local antenna for a nuclear magnetic resonance imaging apparatus, a first antenna system is fashioned as a frame coil. A second antenna system has two sub-coils arranged lying opposite one another, which are both penetrated by the frame coil. The combination of the first and second antenna systems exhibits a circularly polarizing characteristic in a volume that lies inside the frame coil and outside the subcoils.

9 Claims, 3 Drawing Sheets

CIRCULARLY POLARIZING LOCAL ANTENNA FOR A NUCLEAR MAGNETIC RESONANCE APPARATUS

BACKGROUND OF THE INVENTION

1. Field of the Invention

The present invention is directed to a circularly polarizing local antenna for a nuclear magnetic resonance apparatus of the type having a first antenna system fashioned as a frame coil and a second antenna system including a first sub-coil, with the frame coil penetrating the sub-coil.

2. Description of the Prior Art

Either linearly or circularly polarized magnetic high-frequency fields are employed for exciting the nuclei in nuclear magnetic resonance systems such as, for example, nuclear magnetic resonance imaging devices. A linear field can be conceived of as being composed of two oppositely circularly polarized fields of the same size. Only one of the two circular field components, however, is effective for the excitation. This means that twice as much power is theoretically required for an identical excitation given a linearly polarizing antenna than is required for a circularly polarizing antenna.

In medical nuclear magnetic resonance imaging devices, rules for protecting the patient only allow a maximum transmission power. This limits the possible imaging sequences, particularly the number of anatomic slices which can be scanned in a prescribed examination time. Theoretically twice as many but, in practice, not quite twice as many slices, can therefore be scanned in the same time with circularly polarizing antennas as can be scanned with a linearly polarizing antenna.

The employment of circularly polarizing reception antennas also has advantages. A circularly polarizing reception antenna is composed of two linearly polarizing antennas that receive the useful nuclear magnetic resonance signal from spatial directions that are orthogonal relative to one another. The received signals are then added in-phase after a 90° phase shift of one signal. The useful signal is thus doubled, whereas the effective value of the noise is increased by a factor of square root of two. Compared to a linearly polarizing reception antenna, a circularly polarizing reception antenna thus has a theoretical signal-to-noise gain of square root of two. The signal-to-noise gain, however, does not entirely reach the theoretical value in practice. It follows therefrom that circularly polarizing antennas have advantages both in transmission as well as in reception.

German OS 31 33 432 discloses a whole body antenna or body resonator provided for generating and for receiving a circularly polarized high-frequency field in a medical nuclear magnetic resonance imaging device. Two coil groups lying opposite one another are located on an imaginary cylindrical surface, whereby the coil axes of the coil groups reside perpendicularly relative to one another.

For generating a circular, magnetic high-frequency field, the coil groups are fed with high-frequency currents that are phase-shifted by 90° relative to one another. For producing tomograms, a patient to be examined is placed within the cylindrical coil arrangement in the longitudinal direction, so that the individual coils are located above and below as well as at both sides of the patient.

A local antenna for examining the head and with which circular magnetic high-frequency fields can likewise be generated, is also constructed in a way similar to the above-described whole-body antenna.

When tomograms of only one body part are registered with a conventional whole-body antenna, this whole-body antenna then also (unavoidably) receives noise signals from the other body parts because of its large reception area. The signal-to-noise ratio is thus degraded in a partial examination. Local antennas are therefore also employed for partial examinations. Such local antennas, however, are mainly constructed as linearly polarizing antennas because of their usually better manipulability and simpler signal processing. German OS 40 24 582 discloses a circularly polarizing antenna of the type initially described. The antenna is suitable for examinations at the upper body and is composed of two antenna systems. The antenna systems are each composed of a coil having a middle leg and two lateral legs, the lateral legs each having free ends connected to a return. These returns proceeding parallel to the middle legs such that there is an open winding of the two antenna systems. The circularly polarizing characteristics are present in the interior of the two coils. The characteristics required for the circularly polarizing effect, however, reside perpendicular to one another only in a limited region in the interior, so that the antenna has a non-homogeneous sensitivity or field distribution. The useful imaging volume is thus significantly smaller than the total volume of the interior. The signal-to-noise ratio of the antenna is thus also degraded in comparison to an ideal antenna having homogeneous sensitivity.

SUMMARY OF THE INVENTION

It is an object of the present invention is to provide a circularly polarizing local antenna having an enlarged homogeneity region and an improved signal-to-noise ratio.

This object is achieved in accordance with the principles of the present invention in a local antenna having a first antenna system fashioned as a frame coil and a second antenna system having a first sub-coil and a second sub-coil lying opposite the first sub-coil, with the frame coil penetrating both the first and second sub-coils. The circularly polarizing characteristic is present in a volume region that lies inside the frame coil and outside the sub-coils. In a transmission mode, the high-frequency fields generated by the two antenna systems reside perpendicularly relative to one another in the interior of the frame coil. In a reception mode, the two antenna systems receive the high-frequency signals from the interior from two spatial directions residing perpendicularly relative to one another. Given a corresponding 90° phase shift of the signals of the two antenna systems relative to one another, a circularly polarized high-frequency field is generated, the signals of a circularly polarized high-frequency field are received. The homogeneous region of the circular field or the sensitivity can be enhanced with the arrangement of the invention. A 180° phase shift must be taken into consideration in the signal feed or signal pick-up of the two sub-antennas. The signal-to-noise ratio is enhanced in comparison to known local antennas because the homogeneous region of the circular characteristic is enlarged in comparison to known, circularly polarizing local antennas. An improved image quality derives therefrom in medical nuclear magnetic resonance imaging apparatus.

In an advantageous embodiment the sub-coils reside perpendicularly on the frame coil. Special measures for decoupling the two antenna systems thus become superfluous.

In another advantageous embodiment, the frame coil is composed of two U-shaped conductor sections each having two legs, the section being oriented so that the legs of the two systems reside opposite one another, and the legs residing opposite one another are connected to one another via capacitors. The capacitors act as shortening capacitors. The coil cross section can be adapted to the size of the body parts to be examined given a corresponding selection of the capacitors, so that the frame coil does not become unnecessarily large and the signal-to-noise ratio is thus not degraded.

In another advantageous embodiment, the conductor sections have slots parallel to the coil surface. The homogeneity of the fields can be controlled by selecting the width, shape and depth of the slots. Moreover, eddy current losses in the frame coil are thus reduced.

DESCRIPTION OF THE PREFERRED EMBODIMENTS

Figure 1:
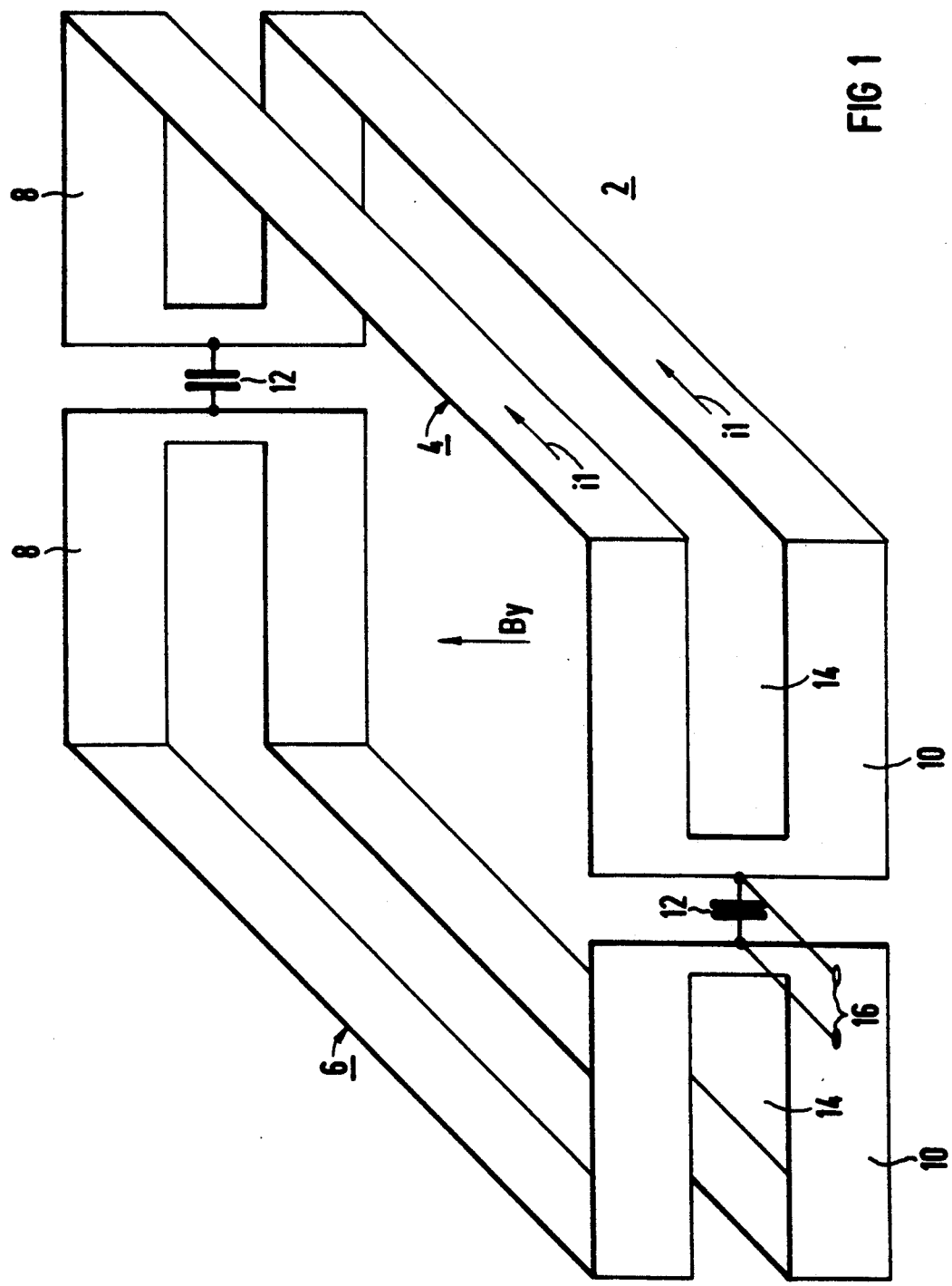
FIG. 1 is a perspective view of a frame coil for a first antenna system as used in a local antenna constructed in accordance with the principles of the present invention.

FIG. 1 shows a frame coil 2 that forms a first antenna system for a circularly polarizing local antenna in accordance with the principles of the present invention. The frame coil 2 is composed of two U-shaped conductor sections 4 and 6 whose legs 8 and 10 reside opposite one another and are connected to one another via capacitors 12. The U-shaped conductor sections 4 and 6 surround a rectangular coil area. A slot 14 is introduced into every conductor section 4 and 6 parallel to the coil surface. The field generated by the coil or the directional characteristic can be controlled by appropriate selection of the slot width, slot shape and slot depth. Terminals 16 via which a transmission signal is supplied to the frame coil 2, or via which a reception signal can be tapped are connected to the ends of the legs 10 of the two U-shaped conductor sections 4 and 6, i.e. parallel to the terminals of one of the two capacitors 12.

Figure 2:
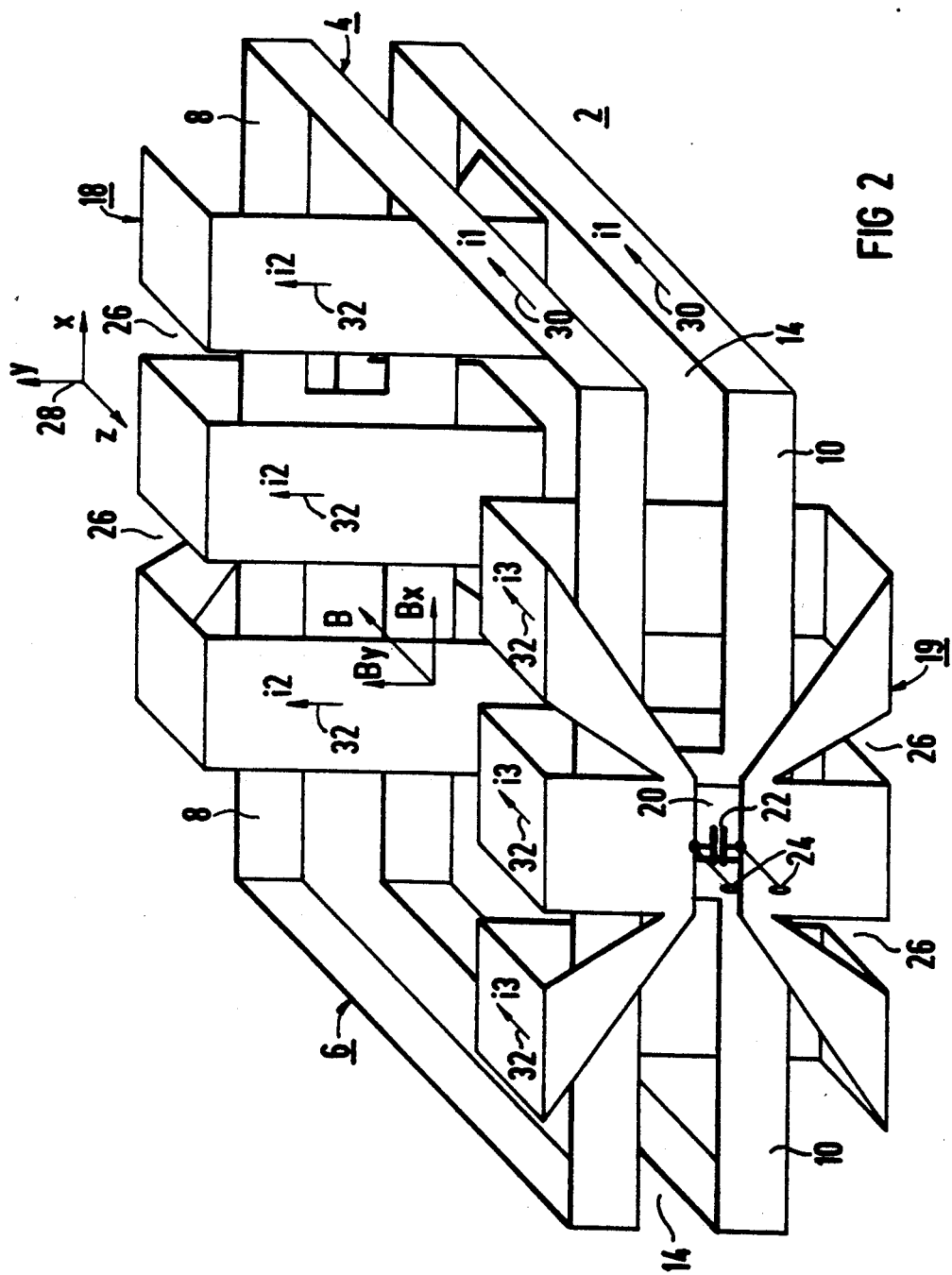
FIG. 2 is a perspective view of a complete circularly polarizing local antenna constructed in accordance with the principles of the present invention.

Proceeding from the first antenna system of FIG. 1, FIG. 2 shows a circularly polarizing local antenna constructed in accordance with the principles of the present invention, as utilized in a nuclear magnetic resonance imaging apparatus, particularly for mammography. The first antenna system 2, and a second antenna system composed of sub-coils 18 and 19, are extended into one another and mutually surround one another, similar to the way the links of a chain are inserted in one another and mutually surround one another. The two sub-coils 18 and 19 of the second antenna system each surround the frame coil 2 over the entire length of the legs 8 and 10 of the conductor sections 4 and 6. A homogenous characteristic is thus achieved over a large volume area lying inside the frame coils 2. Each sub-coil 18 and 19 is composed of a single, rectangularly bent conductor loop, so that the sub-coils 18 and 19 also have a rectangular coil area.

The conductor loops of the sub-coils 18 and 19 are provided with an interruption or gap 20 at that part disposed outside the frame coil 2, this interruption 20 being bridged with a capacitor 22. As the capacitor 12, the capacitor 22 serves the purpose of defining the desired resonant frequency of the sub-coils 18 and 19. Each sub-coil 18 and 19 has its own terminals 24 via which a transmission signal can be supplied to the sub-coils parallel to the capacitor 22, or via which a reception signal can be tapped. For clarity, only the terminals 24 for the sub-coil 19 are shown in FIG. 2.

Each sub-coil 18 and 19 is provided with two slots 26 that proceed parallel to the coil surface. As in the case of the frame coil 2, the antenna characteristic can be controlled by selecting the slot width, slot shape and slot depth. Moreover, the antenna characteristic of the local coil can be influenced when the sub-coils 18 and 19 are displaced relative to one another and with reference to the frame coil 2. The slots 20, moreover, reduce the losses due to eddy currents.

The two antenna systems 2 and 17 (the latter formed by sub-coils 18 and 19) are realized in the illustrated exemplary embodiment with a thin copper band. Both systems can alternatively be constructed of copper-laminated material, wire or tubing.

The circular characteristic of the local coil shall be set forth below for the transmission event as an example. To that end, reference is made to a rectangular coordinate system 28, the x-axis and y-axis thereof lying in the plane of the paper and the z-axis thereof residing perpendicularly upward from the plane of the paper. The frame coil 2 is supplied with a high-frequency current i1 via the terminals 16, the positive direction thereof being defined by the arrows 30. The high-frequency current i1 generates a magnetic field in the y-direction (referenced By) in the inside of the frame coil. The sub-coil 18 is supplied with a high-frequency current i2 having the same frequency as i1 via the terminals 24 (not shown). This current i2 is phase-shifted by 90° relative to the current i1. The positive current direction is defined by the arrows 32. The high-frequency current i2 generates a magnetic field in the x-direction (referenced Bx) inside the frame coil 2. Likewise, a high-frequency current i3 in the sub-coil 19 generates a magnetic field Bx in the x-direction. As a result of the 90° phase shift between the currents i1 and i2, i3, the resultant field vector B rotates in the x-y plane.

Figure 3:
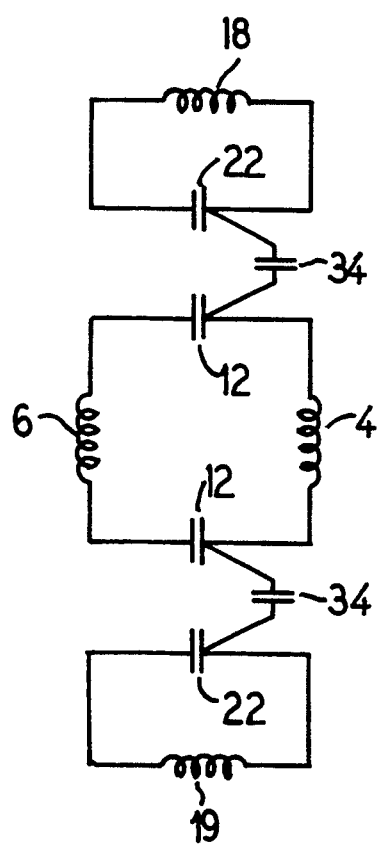
FIG. 3 is a circuit for decoupling the two antenna systems of FIG. 2.

An ideal circular characteristic is only achieved when the two antenna systems 2 and 17 are mutually decoupled from one another. The decoupling can be achieved by a precise right-angled alignment relative to one another. If, due to tolerances, couplings between the antenna systems 2 and 17 nonetheless exist, such undesired couplings can be compensated by decoupling capacitors 34 according to the circuit indicated in FIG. 3. The conductor sections of the coils 2, 18 and 19 are symbolized by inductances. The decoupling capacitors 34 are then each connected between the shortening capacitors 12 and 22; they capacitatively connect the two antenna systems to one another.

When used, the local antenna is aligned such that the basic (static) magnetic field of the nuclear magnetic resonance apparatus proceeds in z-direction.

The circularly polarizing local coil shown in FIG. 2 can also be employed as a two-breast coil in a nuclear magnetic resonance imaging apparatus for mammography. Two local coils of FIG. 2 are thereby arranged side-by-side in one plane. A circular Helmholtz arrangement that is inductively or voltaicly coupled to the local antenna is likewise possible for other areas of employment.

Although modifications and changes may be suggested by those skilled in the art, it is the intention of the inventor to embody within the patent warranted hereon all changes and modifications as reasonably and properly come within the scope of his contribution to the art.

I claim as my invention:

1. A circularly polarizing local antenna, for a nuclear magnetic resonance apparatus, comprising:
   a first antenna system in the form of a frame coil;
   a second antenna system having a first sub-coil and a second sub-coil disposed opposite said first sub-coil;
   said first and second sub-coils being disposed perpendicularly on said frame coil; and
   said frame coil penetrating both said first and second sub-coils so that said first and second antenna systems, in combination, comprise means for generating a circularly polarizing characteristic in a volume within said frame coil and outside said first and second sub-coils.

2. A local antenna as claimed in claim 1 wherein said frame coil has a rectangular coil area.

3. A local antenna as claimed in claim 1 wherein said frame coil consists of two U-shaped conductor sections, each conductor section having two legs, with the respective legs of said conductor sections disposed opposite each other forming opposite pairs of legs, and the legs each pair of legs being connected by a capacitor.

4. A local antenna as claimed in claim 3 wherein said frame coil has a coil area and wherein said U-shaped conductor sections each have a section parallel to said coil area having at least one slot therein.

5. A local antenna as claimed in claim 1 wherein at least one of said sub-coils has a rectangular coil area.

6. A local antenna as claimed in claim 5 wherein said at least one sub-coil having a rectangular coil area consists of a single conductor loop bent at right angles.

7. A local antenna as claimed in claim 6 wherein said conductor loop has a gap therein disposed outside of said frame coil, and further comprising a capacitor bridging said gap.

8. A local antenna as claimed in claim 7 wherein said conductor loop has at least one slot disposed parallel to said coil area.

9. A local antenna as claimed in claim 6 wherein said conductor loop has at least one slot disposed parallel to said coil area.

* * * * *